(12) United States Patent
Engl et al.

(10) Patent No.: US 8,344,263 B2
(45) Date of Patent: Jan. 1, 2013

(54) HOUSING FOR AN OPTOELECTRONIC COMPONENT EMITTING ELECTROMAGNETIC RADIATION, COMPONENT EMITTING ELECTROMAGNETIC RADIATION, AND METHOD FOR THE PRODUCTION OF A HOUSING OR A COMPONENT

(75) Inventors: Moritz Engl, Regensburg (DE); Florin Oswald, Rattenberg (AT)

(73) Assignee: OSRAM Opto Semiconductors GmbH, Regensburg (DE)

( * ) Notice: Subject to any disclaimer, the term of this patent is extended or adjusted under 35 U.S.C. 154(b) by 719 days.

(21) Appl. No.: 11/989,282

(22) PCT Filed: Jul. 20, 2006

(86) PCT No.: PCT/DE2006/001261
§ 371 (c)(1),
(2), (4) Date: Oct. 31, 2008

(87) PCT Pub. No.: WO2007/009447
PCT Pub. Date: Jan. 25, 2007

(65) Prior Publication Data
US 2009/0116209 A1 May 7, 2009

(30) Foreign Application Priority Data

Jul. 21, 2005  (DE) .................. 10 2005 034 166

(51) Int. Cl.
*H05K 9/00* (2006.01)
(52) U.S. Cl. ....... 174/260; 174/50; 174/50.54; 174/520; 174/382; 174/394; 361/813; 361/816; 361/818

(58) Field of Classification Search .............. 174/50, 174/50.51, 520, 546, 250–266, 35 R, 35 MS, 174/35 GC, 377, 391, 382; 361/714, 800–818, 361/831; 385/14, 89, 92, 93, 88, 35, 139; 257/79, 86–91, 94, 95, 98, 99, 100–103
See application file for complete search history.

(56) References Cited

U.S. PATENT DOCUMENTS

| 4,528,448 | A | * | 7/1985 | Doggett | 250/231.14 |
| 4,611,886 | A | * | 9/1986 | Cline et al. | 385/92 |
| 4,822,536 | A | | 4/1989 | Voinis et al. | |
| 5,258,686 | A | * | 11/1993 | Segoshi et al. | 313/313 |

(Continued)

FOREIGN PATENT DOCUMENTS

CN  1519959  8/2004

(Continued)

OTHER PUBLICATIONS

I. Schnitzer et al., "30% external quantum efficiency from surface textured, thin-film light-emitting diodes", Appl. Phys. Letters, vol. 63, No. 16, pp. 2174-2176, Oct. 18, 1993.

*Primary Examiner* — Michail V Datskovskiy
(74) *Attorney, Agent, or Firm* — Cozen O'Connor (57) ABSTRACT

A housing for an electromagnetic-radiation-emitting opto-electronic component. Exterior side faces of the housing are at least partly provided with a screening layer suitable for screening an electromagnetic radiation. A lateral emission of electromagnetic radiation from the housing, which is disadvantageous for many applications, is thereby intended to be avoided. An electromagnetic-radiation-emitting component having a housing of this type and a method for producing a corresponding housing or component are additionally described.

25 Claims, 6 Drawing Sheets

U.S. PATENT DOCUMENTS

| | | | | |
|---|---|---|---|---|
| 5,731,963 A * | 3/1998 | Heiss et al. | | 361/814 |
| 5,841,067 A * | 11/1998 | Nakamura et al. | | 174/382 |
| 5,864,088 A * | 1/1999 | Sato et al. | | 174/386 |
| 6,066,861 A | 5/2000 | Höhn et al. | | |
| 6,200,630 B1 * | 3/2001 | Eriksson | | 427/123 |
| 6,284,363 B1 * | 9/2001 | Maeda et al. | | 428/328 |
| 6,323,418 B1 * | 11/2001 | Tiburtius et al. | | 174/387 |
| 6,426,457 B1 * | 7/2002 | Toyoda et al. | | 174/377 |
| 6,517,258 B1 * | 2/2003 | Keska et al. | | 385/92 |
| 6,521,150 B1 * | 2/2003 | Maeda et al. | | 264/102 |
| 6,583,401 B2 * | 6/2003 | Giebler et al. | | 250/214.1 |
| 6,601,998 B2 * | 8/2003 | Arsenault et al. | | 385/88 |
| 6,645,783 B1 * | 11/2003 | Brunner et al. | | 438/26 |
| 6,795,461 B1 * | 9/2004 | Blair et al. | | 372/36 |
| 6,818,291 B2 * | 11/2004 | Funkenbusch et al. | | 428/336 |
| 6,818,821 B2 * | 11/2004 | Fujieda et al. | | 174/394 |
| 6,838,748 B2 * | 1/2005 | Ishio et al. | | 257/659 |
| 6,919,387 B2 * | 7/2005 | Fujieda et al. | | 523/137 |
| 7,096,054 B2 * | 8/2006 | Abdul-Hafiz et al. | | 600/344 |
| 7,135,643 B2 * | 11/2006 | van Haaster et al. | | 174/382 |
| 7,239,261 B2 * | 7/2007 | Fujieda et al. | | 342/1 |
| 7,288,217 B2 * | 10/2007 | Hareyama et al. | | 252/500 |
| 7,327,022 B2 * | 2/2008 | Claydon et al. | | 257/689 |
| 7,537,800 B2 * | 5/2009 | Sasaki et al. | | 427/108 |
| 7,679,100 B2 * | 3/2010 | Schwenkschuster et al. | | 257/100 |
| 8,071,935 B2 * | 12/2011 | Besko et al. | | 250/239 |
| 2002/0110337 A1 * | 8/2002 | Loeffelholz et al. | | 385/92 |
| 2004/0032728 A1 | 2/2004 | Galli | | |
| 2004/0039272 A1 * | 2/2004 | Abdul-Hafiz et al. | | 600/322 |
| 2004/0061433 A1 * | 4/2004 | Izuno et al. | | 313/498 |
| 2004/0075100 A1 * | 4/2004 | Bogner et al. | | 257/99 |
| 2004/0119668 A1 | 6/2004 | Homma et al. | | |
| 2005/0006794 A1 * | 1/2005 | Kashiwagi et al. | | 257/788 |
| 2006/0014429 A1 * | 1/2006 | Schmid et al. | | 439/596 |
| 2007/0008734 A1 | 1/2007 | Bogner et al. | | |
| 2008/0265266 A1 * | 10/2008 | Bogner et al. | | 257/98 |

FOREIGN PATENT DOCUMENTS

| | | | |
|---|---|---|---|
| DE | 195 36 451 | | 4/1997 |
| DE | 196 00 678 | | 7/1997 |
| DE | 100 32 839 | | 2/2002 |
| EP | 0 230 078 | | 12/1986 |
| EP | 1 049 179 | | 4/2000 |
| EP | 1 189 291 | | 9/2001 |
| EP | 1 189 291 | | 3/2002 |
| JP | 363069029 A | * | 3/1988 |
| JP | 63-105154 | | 7/1988 |
| JP | 05-027688 | | 2/1993 |
| JP | 2002-164583 | | 6/2002 |
| JP | 2003-197975 | | 7/2003 |
| JP | 02003270489 A | * | 9/2003 |
| JP | 2003-324217 | | 11/2003 |
| JP | 2005-032658 | | 2/2005 |
| JP | 2005-191111 | | 7/2005 |
| WO | WO 98/12757 | | 3/1998 |
| WO | WO 2004/088200 | | 10/2004 |

* cited by examiner

HOUSING FOR AN OPTOELECTRONIC COMPONENT EMITTING ELECTROMAGNETIC RADIATION, COMPONENT EMITTING ELECTROMAGNETIC RADIATION, AND METHOD FOR THE PRODUCTION OF A HOUSING OR A COMPONENT

RELATED APPLICATIONS

This is a U.S. national stage of application No. PCT/DE2006/001261, filed on 20 Jul. 2006.

This patent application claims the priority of German patent application no. 10 2005 034 166.7 filed Jul. 21, 2005, the disclosure content of which is hereby incorporated by reference.

FIELD OF THE INVENTION

The invention relates to a housing for an optoelectronic component which is suitable for emitting an electromagnetic radiation during its operation. It additionally encompasses an electromagnetic-radiation-emitting component having a housing of this type and also a method for producing a housing or component of this type.

BACKGROUND OF THE INVENTION

Housings for electromagnetic-radiation-emitting optoelectronic components having a basic body, which defines a cutout, are known. The bottom of said cutout is provided for mounting a luminescence diode chip. The internal walls of the cutout may be formed in the manner of a reflector, so that part of an electromagnetic radiation emitted by the luminescence diode chip can be deflected into a desired emission solid angle by means of the internal walls.

In many cases, the basic body for housings of this type comprises a plastic. In addition, housings are also known, for example, in which the basic body partly or completely comprises a ceramic material.

Optoelectronic components which emit an electromagnetic radiation are being employed more and more often in headlight or projection applications. One example of a headlight in which electromagnetic-radiation-emitting luminescence diodes are used is specified in WO 2004/088200. The headlight elements specified in said document can also be used for projection applications, by way of example.

In headlight or projection applications it is important for an electromagnetic radiation emitted by luminescence diode chips to be emitted with a highest possible radiation density into a predetermined, narrow solid angle. For this purpose, by way of example, cones of rays are projected onto a desired plane by means of optics such as projection lenses. In applications of this type, irregularities in the emission characteristic of optoelectronic components used may be amplified and therefore be of particularly great significance. There is therefore a need for corresponding components which, with regard to their emission properties, are embodied specifically for applications of this type.

SUMMARY OF THE INVENTION

One object of the invention is to provide a housing of the type mentioned in the introduction which is improved compared with known housings by means of technically simple measures with regard to emission characteristics that can be achieved. The housing is intended, in particular, to be better suited to headlight and/or projection applications. Another object of the invention is to provide a component having a housing of this type and a method for producing a housing of this type.

A housing of the type mentioned in the introduction is specified which has exterior side faces which are at least partly provided with a screening layer. The screening layer is suitable for screening an electromagnetic radiation, provision being made, in particular, for externally screening an electromagnetic radiation that is generated or is to be generated in the interior of the housing. As a result, in the case of corresponding optoelectronic components having a housing of this type, a lateral emergence of electromagnetic radiation from the housing can advantageously be significantly reduced or completely avoided.

In conventional electromagnetic-radiation-emitting components it has been established that housing bodies which have a plastic and/or a ceramic material are often partly transmissive for the electromagnetic radiation. Particularly in the case of housings having thin housing walls, part of the electromagnetic radiation generated in the interior of the housing penetrates through said walls. Consequently, the electromagnetic radiation is emitted not only into a preferred solid angle, but also laterally from the housing.

Such a laterally emitted electromagnetic radiation is not disturbing for many applications, since it makes up only a small proportion of the radiation intensity emitted in total from the housing. It has been established, however, that the laterally emitted electromagnetic radiation can have a disturbing effect particularly in headlight and projection applications. This is the case for example in applications in which a cone of rays with a well-defined luminance distribution and sharp bright/dark transitions is to be obtained.

With the measure of providing exterior side faces of the housing with a screening layer, a technically simple and efficient means for improving the emission characteristic of housings of this type is specified. It is advantageous that applying a screening layer to exterior side faces of the housing does not, in principle, require a special housing design, rather it can be carried out for many conventional housings.

Exterior side faces of the housing are to be understood as external faces of a housing body of the housing which are inclined away from an emission axis provided for a component having the housing. The emission axis runs, in particular, perpendicular to a chip mounting plane or a housing mounting plane of the housing and also through a region provided for a luminescence diode chip such as, for example, a light-emitting diode. External faces whose main plane of extent extends perpendicular to the emission axis or is inclined towards the emission axis are not exterior side faces. Moreover, rear-side external faces that face away from an emission side of the housing preferably likewise do not come under the expression "exterior side faces".

The exterior side faces may be partly or completely embodied in planar fashion. It is also possible as an alternative or in addition for the exterior side faces to be concavely or convexly curved or to be structured in some manner or other.

The screening layer is suitable, in particular, for screening an electromagnetic radiation which encompasses a spectral range of an electromagnetic radiation emitted by a luminescence diode chip, the luminescence diode chip being provided for a component having the housing. The screening layer is particularly preferably suitable for completely screening an electromagnetic radiation, that is to say that the screening layer is particularly preferably opaque to an electromagnetic radiation of a wavelength range to be screened. However, it is also possible for the screening layer also to be partly transmissive for electromagnetic radiation. By way of example, it may be partly transmissive for electromagnetic radiation of a wavelength range that is not necessarily to be screened or else for an electromagnetic radiation that is to be screened. The electromagnetic radiation to be screened is preferably visible light.

The screening layer preferably has a total transmittance of less than or equal to 0.1, particularly preferably of less than or equal to 0.05, for a wavelength range to be screened of an electromagnetic radiation emitted by a luminescence diode provided for the component having the housing. Said total transmittance is particularly advantageously approximately 0 at least for the visible portion of the radiation.

In the present case the term "screening layer" does not encompass electrical connection conductors or electrical conductor tracks of the housing. Rather, the housing is either free of electrical conductor tracks or electrical connection conductors on the exterior side faces or the housing has, at the exterior side faces, at least one screening layer in addition to any electrical connection conductors or electrical conductor tracks present.

In accordance with one advantageous embodiment, the screening layer has a material that is reflective for the electromagnetic radiation. As a result, the electromagnetic radiation can be reflected back into a housing body from the exterior side faces and is therefore not necessarily lost for a utilization.

In addition or as an alternative, the screening layer advantageously has a material that is absorbent for the electromagnetic radiation. Suitable absorbent materials may advantageously be particularly cost-effective and screen the electromagnetic radiation with high efficiency. The absorbent material particularly preferably comprises a black material, that is to say that the colour of the material is perceptible to the human eye as a black hue.

In accordance with one expedient embodiment, the screening layer has a lacquer. Lacquers are cost-effective materials which can be applied in a technically simple manner.

The exterior side faces expediently comprise external faces of a housing body which has ceramic material. In addition or as an alternative, the exterior side faces comprise external faces of a housing body which, in accordance with a further expedient embodiment, has at least one plastic. Plastics and ceramic materials such as are used for conventional optoelectronic housings are often transmissive for electromagnetic radiation such as, for example, visible light. It is therefore particularly expedient to provide housings of this type with the screening layer.

Particularly advantageously, the exterior side faces of the housing are at least partly inclined with respect to a plane running perpendicular to a mounting plane of the housing. The exterior side faces are inclined, in particular, in such a way that they at least partly face away from the mounting plane of the housing. This may be advantageous for applying the screening layer, since the inclined portions of the exterior side faces do not run perpendicular to the mounting plane of the housing and are thus accessible not only laterally but also from above. A top side of the housing is principally to be understood as a side which faces away from a mounting plane of the housing.

Particularly preferably, the exterior side faces are inclined with respect to the plane at least partly between 30° and 60° inclusive.

Advantageously, at least one exterior side face is essentially completely covered with the screening layer. In this context a side face is to be understood as the surface of a housing body on one of its main sides. By way of example, a housing body having an essentially square or rectangular basic form has four lateral main sides. In accordance with this embodiment, the external face on at least one of the main sides is essentially completely covered with the screening layer.

Furthermore, a housing is specified in which the screening layer advantageously has plastic or comprises plastic. Plastics may advantageously have absorbent properties and be able to be applied in the form of a coating, for example.

The electromagnetic-radiation-emitting optoelectronic component comprises the housing and at least one luminescence diode, for example in the form of a luminescence diode chip, which is mounted in the housing.

A method for producing a housing for an optoelectronic component or an electromagnetic-radiation-emitting component is specified. One method step comprises providing a housing or a component having a housing. A further method step comprises applying a screening layer to at least one portion of exterior, laterally disposed surfaces of the housing, that is to say to at least one portion of exterior side faces of the housing.

Particularly preferably, applying the screening layer comprises the use of pad printing. Pad printing is an indirect printing method that is suitable in particular for printing plastic bodies. By means of pad printing, even nonplanar, for example convexly or concavely curved, faces can be provided with a material to be applied.

In addition or as an alternative, applying the screening layer may comprise the use of at least one of the methods of screen printing, inkjet printing, plastic coating and powder coating.

DETAILED DESCRIPTION OF THE DRAWINGS

In the exemplary embodiments and figures, identical or identically acting constituent parts are provided with the same reference symbols in each case. The illustrated constituent parts and the size relationships among the constituent parts should not necessarily be regarded as true to scale. Rather, some details of the figures may be illustrated in an exaggerated size in order to afford a better understanding. This applies particularly to the exemplary illustrations of the screening layer.

Figure 1:
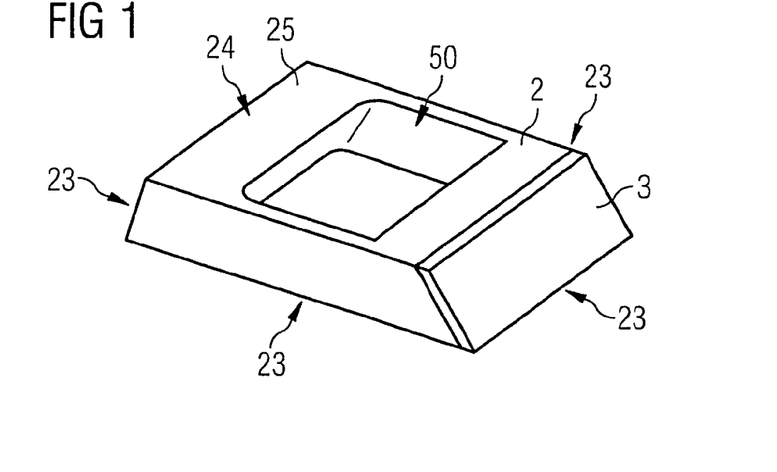
FIGS. 1 to 3 show different schematic perspective illustrations of a housing in accordance with a first exemplary embodiment.
Figure 2:
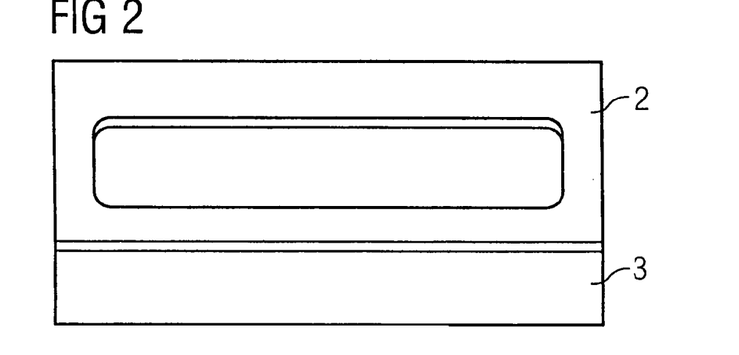
Figure 3:
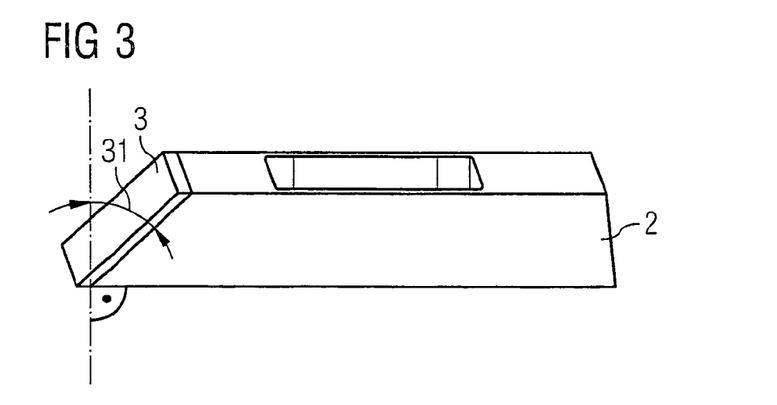

The housing 2 illustrated in FIGS. 1 to 3 has a housing body 25 having a cavity 50. The opening of the cavity 50 has an elongate cross-sectional area embodied for example in the manner of a rectangle having rounded edges. The cavity 50 is provided for the purpose of mounting at least one luminescence diode chip in it and electrically conductively connecting said chip. The housing illustrated in FIGS. 1 to 3 is provided for example for four or five luminescence diode chips which are mounted at a bottom of the cavity 50 in a linear arrangement, by way of example.

The housing body 25 has for example a plastic material or comprises such a plastic material. A thermoplastic or thermosetting plastic is preferably used for this, for example polyphthalamide. Fillers may be added to the plastic material. Examples of suitable fillers are barium sulphate, anatase (which is a modification of $TiO_2$) and polytetrafluorethylene (PTFE, for example Teflon), which are preferably added with a proportion by volume of up to 50%. A furthermore preferred proportion by volume lies in the range of between approximately 5% and approximately 15%.

The housing 2 has an external face 24 of the housing body, which external face is disposed on the front side and extends perpendicular to a main emission direction of the housing that is provided for a component. In addition, the housing body has four exterior side faces 23. One of these exterior side faces 23 is provided with a screening layer 3.

In the exemplary embodiment illustrated in FIGS. 1 to 3, the screening layer 3 completely covers the one exterior side face. However, it is also possible for this exterior side face 23 to be only partly covered by the screening layer 3. By way of example, only an upper half may be provided with the screening layer 3.

The exterior side face 23 provided with the screening layer 3 is inclined with respect to a plane running perpendicular to a mounting plane of the housing. The side face is embodied in planar fashion and is tilted by an angle 31 with respect to the plane, see FIG. 3. The angle 31 is between 30° and 60° inclusive, for example 50°.

The screening layer 3 comprises a reflective material, for example, which has metallic material such as silver, by way of example. In order to form the screening layer, e.g. a silver layer having a sufficiently high layer thickness is applied on the corresponding exterior side face 23. Silver has a high reflectivity for a large spectral range of visible light. In order to obtain complete screening, the silver layer must not be just a few monolayers thick, since otherwise it is partly transmissive for electromagnetic radiation. It has a thickness of 10 μm by way of example.

In addition or as an alternative, the screening layer 3 may also have absorbent material, by way of example. Metallic material, having predominantly absorbent properties for an envisaged spectral range, is likewise appropriate for this, by way of example. In the case of the absorbent material, too, it is important not to apply it in an excessively thin layer, in order that an electromagnetic radiation generated in the interior of the housing can be screened to the greatest possible extent. The screening layer has a total transmittance of less than or equal to 0.01, by way of example, for a wavelength range to be screened. By way of example, lacquers or plastics are also appropriate as absorbent material.

In accordance with a further exemplary embodiment, the screening layer 3 has a reflective layer which is applied on the corresponding exterior side face 23 and on which an absorbent layer is in turn applied. The absorbent layer is a black lacquer or a black plastic, by way of example. These are absorbent in particular for visible electromagnetic radiation. As an alternative, the screening layer 3 may for example also only comprise a sufficiently thick black lacquer or black plastic layer.

Figure 4:
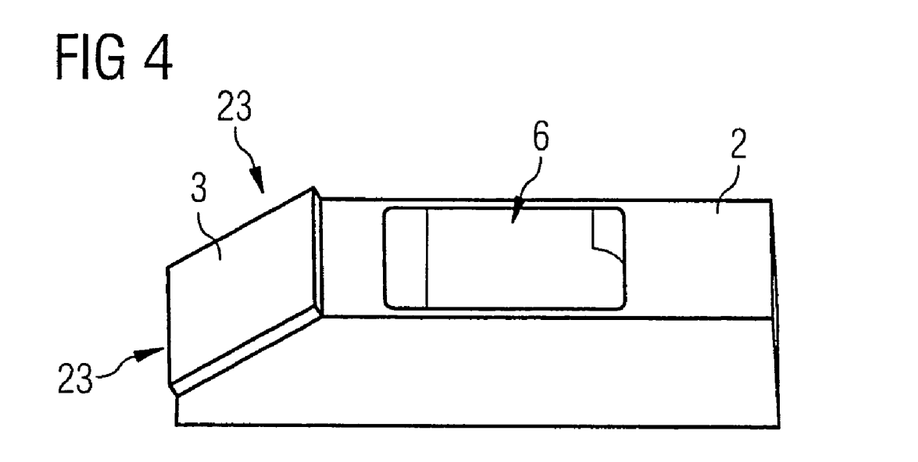
FIGS. 4 and 5 show different schematic perspective illustrations of a housing in accordance with a second exemplary embodiment.
Figure 5:
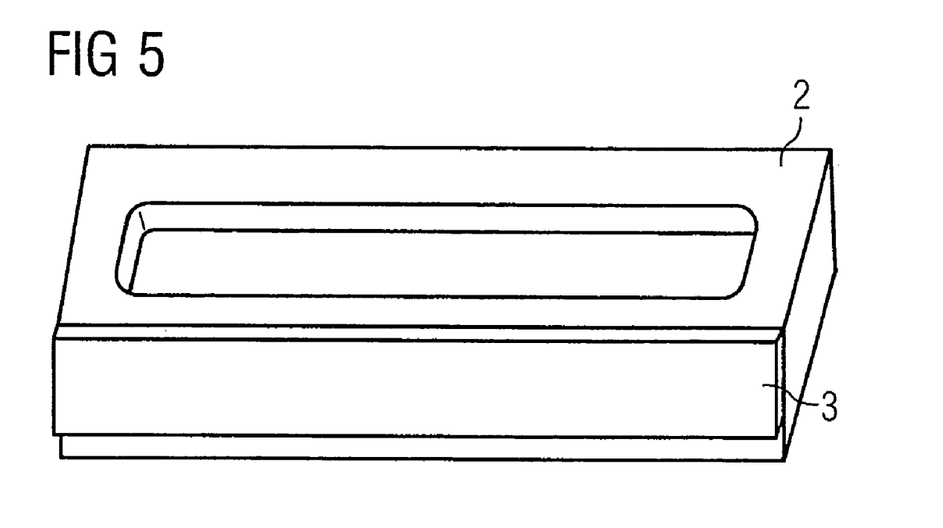

In the case of the housing 2 illustrated in FIGS. 4 and 5, in contrast to the housing described above with reference to FIGS. 1 to 3, an exterior side face 23 is only partly covered with a screening layer 3. The exterior side face 23 that is partly covered with the screening layer 3 has a first and a second portion. Both portions are embodied in planar fashion, by way of example. The first portion runs for example perpendicular with respect to a mounting plane of the housing 2. The second portion is inclined, for example by 55°, with respect to the first portion. Said second portion is completely covered with the screening layer 3, by way of example. The first portion is free of the screening layer. As an alternative, the first portion may also be covered with the screening layer.

For the rest, the housing 2 illustrated in FIGS. 4 and 5 may be embodied like the housing explained above with reference to FIGS. 1 to 3. The same applies to possible compositions, materials and constructions of the screening layer 3.

Figure 6:
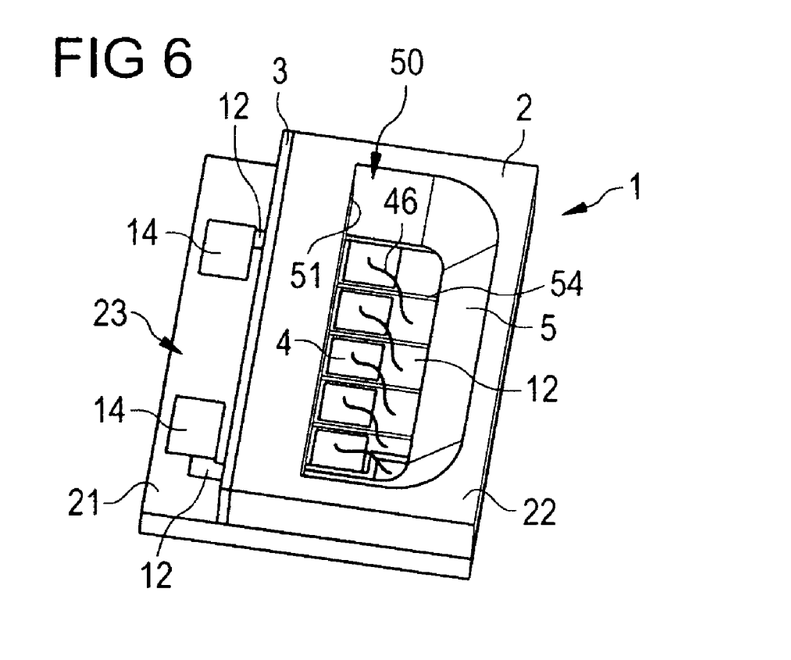
FIG. 6 shows a schematic perspective illustration of a component in accordance with a first exemplary embodiment and of a housing in accordance with a third exemplary embodiment.
Figure 7:
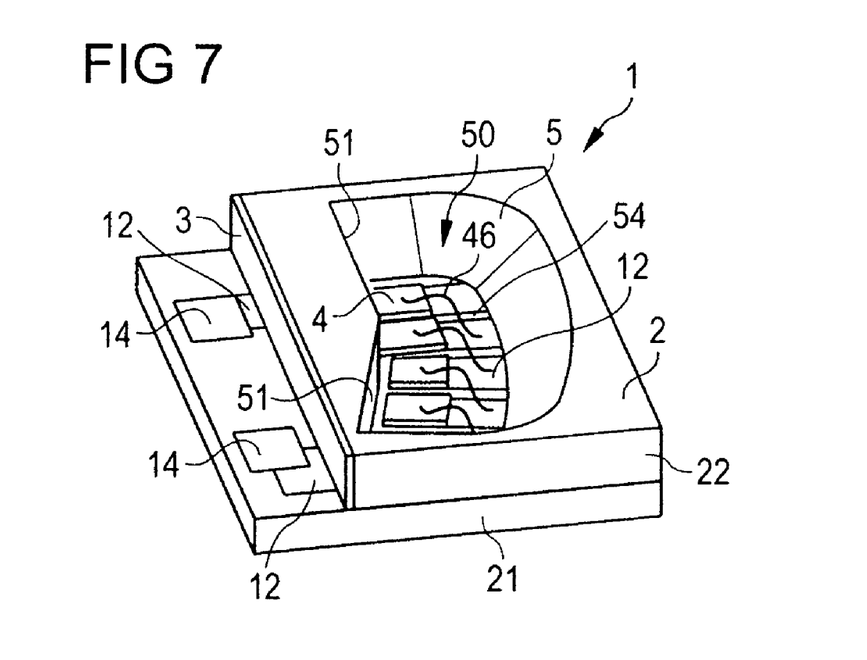
FIG. 7 shows a schematic perspective illustration of a component in accordance with a second exemplary embodiment and of a housing in accordance with a fourth exemplary embodiment.

The components illustrated in FIGS. 6 and 7 have a housing 2 having a carrier 21 and a frame 22 arranged on the carrier 21. The frame 22 has internal walls 5 which delimit a cavity 50. A plurality of semiconductor chips 4 are arranged in a linear arrangement in the cavity 50 embodied like a trench.

In the case of the component illustrated in FIG. 6, the luminescence diode chips 4 are arranged along a straight line. In contrast thereto, in the case of the component illustrated in FIG. 7, the luminescence diode chips 4 are arranged partly along a first straight line and partly along a second straight line, the first and second straight lines forming an angle of 15°, for example, with one another. The arrangement of the semiconductor chips thus has a bend.

The internal walls 5 of the cavity 50 are at a relatively small distance from the luminescence diode chips 4. The distance is for example less than or equal to a lateral edge length of the luminescence diode chips 4. The bottom of the cavity 50 correspondingly has a relatively small area.

The luminescence diode chips 4 are electrically mounted in the housing 2; by way of example, they are connected in series with one another in this case. For this purpose, the bottom of the cavity 50 has a plurality of internal electrical contact areas 12, the luminescence diode chips, e.g. on their side facing the bottom 54 of the cavity 50, being electrically conductively connected to the corresponding internal contact areas 12 e.g. by means of soldering or conductive adhesive and bearing on a portion of the respective contact area 12. A side of the luminescence diode chips 4 that faces away from the internal contact areas 12 is electrically conductively connected to the corresponding contact area e.g. by means of a bonding wire 46.

Two of the internal contact areas 12 extend on the carrier 21 as far as a region of the carrier 21 that is offset laterally with respect to the frame 22, where they are electrically conductively connected to external contacts 14 of the component 1, via which the component 1 can be electrically connected externally. Stated another way, these two internal contact areas 12 extend from inside the frame 22 towards the external contacts 14. Since the external contacts 14 are located outside the frame 22, said internal contact areas 12 extend to a region outside the frame 22 where they are electrically connected to the respective external contact 14 (said region is not covered by the frame 22, i.e. it is offset laterally with respect to the frame 22).

The luminescence diode chips 4 emit e.g. an electromagnetic radiation from a blue or ultraviolet wavelength range during their operation.

By way of example, the frame has aluminium oxide or comprises the latter. As an alternative, it is also possible for the frame to have or comprise a less reflective material, such as e.g. aluminium nitride or a liquid crystal polymer (LCP). The use of LCP as a material for the frame 22 has the advantage that the material can be thermally adapted to the carrier 21. The carrier 21 has as material aluminium nitride, for example, which is cost-effective and has a high thermal conductivity. By way of example, silicon or silicon carbide are also possible as alternative materials.

The housing 2 of the components 1 illustrated in FIGS. 6 and 7 has an internal wall delimiting the cavity 50 on a side along the arrangement of the luminescence diode chips 4, at least one section of the internal wall being embodied as a screening wall 51. The emission of the radiation into an undesirable spatial region can be suppressed by such a screening wall. For this purpose, the screening wall 51 expediently runs essentially at an angle of greater than or equal to 80° and less than or equal to 110° with respect to a mounting plane of the luminescence diode chips 4. In particular, the screening wall runs essentially perpendicular to the mounting plane.

The luminescence diode chips 4 are arranged at a distance of, for example, less than or equal to 100 µm from the screening wall 51. Given such a small distance, an effective screening effect of the screening wall 51 can be achieved even when the screening wall 51 is made relatively low, that is to say when it has a small height. In addition, as a result of said small distance, part of the electromagnetic radiation emitted by the luminescence diode chips 4 impinges on the screening wall 51 with a high radiation intensity per area, whereby it largely becomes possible both to avoid radiation at an undesirable solid angle and for the electromagnetic radiation to be emitted into a desired, preferably narrow, solid angle and with a high radiation density.

These properties are desirable particularly in the case of headlights, for example in the case of automobile headlights, which are intended to illuminate a specific solid angle as brightly as possible. In the case of automobile headlights, by way of example, the intention on the one hand is for the travel path, and that is to say in particular the road, to be illuminated as brightly as possible, but on the other hand oncoming vehicles must not be dazzled, so that an emission of light into the upper solid angle is undesirable and avoided to the greatest possible extent. This is precisely what can be achieved by means of a component with a screening wall 51. In addition, the elongated arrangement of the luminescence diode chips 4 enables a bright and areal, homogeneous illumination of the path or road across the entire width of the road.

In the case of the components 1 illustrated in FIGS. 6 and 7, that exterior side face 23 of the frame 21 which is opposite the screening wall 51 is in each case provided with a screening layer 3. The latter may be embodied in the manner already described above. Avoidance of radiation emission into an undesirable solid angle can be realized more extensively by means of the screening layer 3.

Figure 8:
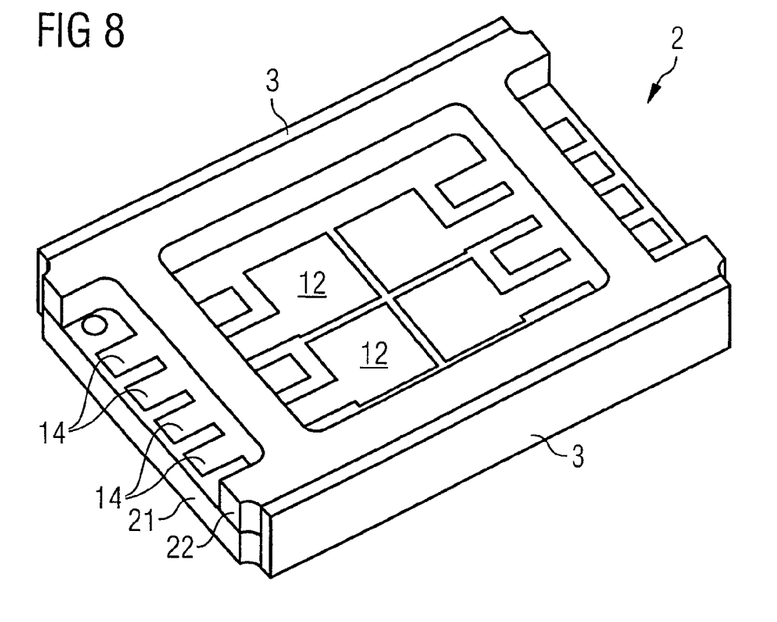
FIG. 8 shows a schematic perspective illustration of a housing in accordance with a fifth exemplary embodiment.

The housing 2 illustrated in FIG. 8 likewise has a carrier 21 and a frame 22. On two mutually opposite sides, the housing 2 has electrical external contact areas 14 which are electrically conductively connected to internal electrical contact areas 12. The housing 2 is provided for a number n of luminescence diode chips and has 2*n external contact areas 14, so that it is possible for each luminescence diode chip mounted in such a housing 2 to be driven independently of the other luminescence diode chips. The external contact areas 14, electrical contact areas 12 and conductor tracks between these contact areas are formed for example by means of metal coatings on the carrier 21. A suitable metal is gold, by way of example.

At those sides at which no external contact areas 14 are formed, the external side faces 23 of the housing 2 are in each case provided with a screening layer 3. The screening layer 3 extends over external side faces 23 both of the carrier 21 and of the frame 22. Frame and carrier have a ceramic material, for example, such as aluminium nitride, by way of example, or comprise such a material.

Figure 9:
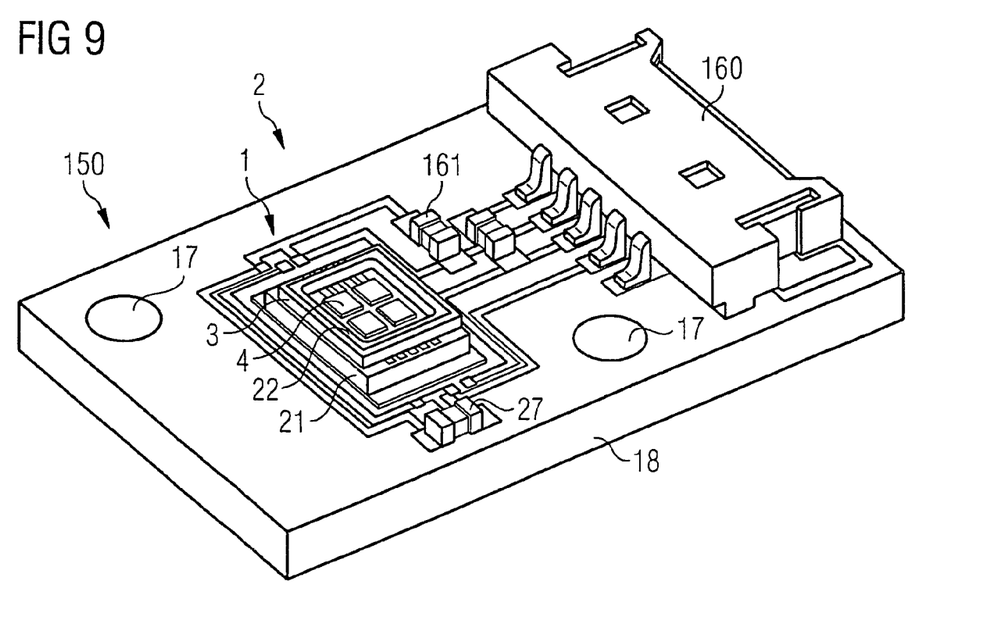
FIG. 9 shows a schematic perspective illustration of a luminous module with a component in accordance with a third exemplary embodiment and a housing in accordance with a sixth exemplary embodiment.

FIG. 9 illustrates a luminous module 150 having a single component 1. The component 1 has such small dimensions that it can advantageously be used in many kinds of ways and be mounted in a technically simple manner.

The luminous module 150 has a module carrier 18, into which two holes 17 are introduced. The holes 17 serve for mechanical mounting and, as an alternative or in addition, also for thermal connection of the luminous module 150. By way of example, the luminous module 150 can be placed by the holes 17 over one or two mounting pins with or without a thread and be fixed by means of clamps or screws.

The luminous module 150 illustrated in FIG. 9 contains a mating connector 160, so that electrical contact can be made with it externally by means of a corresponding connector. In addition, the luminous module 150 has, for example, an overvoltage protection for the luminescence diode chips 4. Such protection is provided for example in the form of at least one varistor 161 connected in parallel with the component 1 or with luminescence diode chips 4.

The component 1 contained in the luminous module 150 is constructed similarly to the component 1 explained above with reference to FIG. 8. It has a carrier 21, a frame 22 and four luminescence diode chips 4. The frame 22 is provided with a screening layer 3 all around at all of its external side faces. By contrast, the carrier 21 is free of a screening layer, by way of example. As an alternative, the luminous module may, of course, also have a different component having e.g. a housing 2 as described above by way of example with reference to FIGS. 1 to 8.

The housings 2 and components 1 described may be used in particular for a headlight module, in particular also for automobile applications. They may likewise be suitable for projection applications.

The components 1 emit white light, for example, for which purpose they have a luminescence conversion element, by way of example, which converts the radiation of a first wavelength range that is emitted by the luminescence diode chips 4 at least partly into a radiation of a second wavelength range, which is different from the first wavelength range. White light can be generated either by the radiation emitted by the luminescence diode chip being mixed with the converted radiation or by the converted radiation having colour components which, mixed together, produce white light.

The luminescence conversion material may contain at least one phosphor. By way of example, inorganic phosphors, such as garnets doped with rare earths (in particular Ce), or organic phosphors, such as perylene phosphors, are suitable for this purpose. Further suitable phosphors are presented in U.S. Pat. No. 6,066,861, for example, the content of which in this respect is hereby incorporated by reference.

The luminescence diode chips 4 may either be encapsulated with an encapsulant based for example on silicone, or be covered with a radiation-transmissive covering plate, whereby they are protected from external influences.

The construction of the housing 2 with a carrier 21 and a frame 22 and also with contact areas 12, 14 applied on the carrier 21 means that the component 1 can be produced in a simple manner that does not require e.g. complicated production of plated-through holes. As an alternative, however, the housing body may also be formed in one piece, for example by encapsulating a leadframe by injection-moulding, said leadframe comprising the respective contacts for the luminescence diode chips 4 and the component 1.

Figure 10:
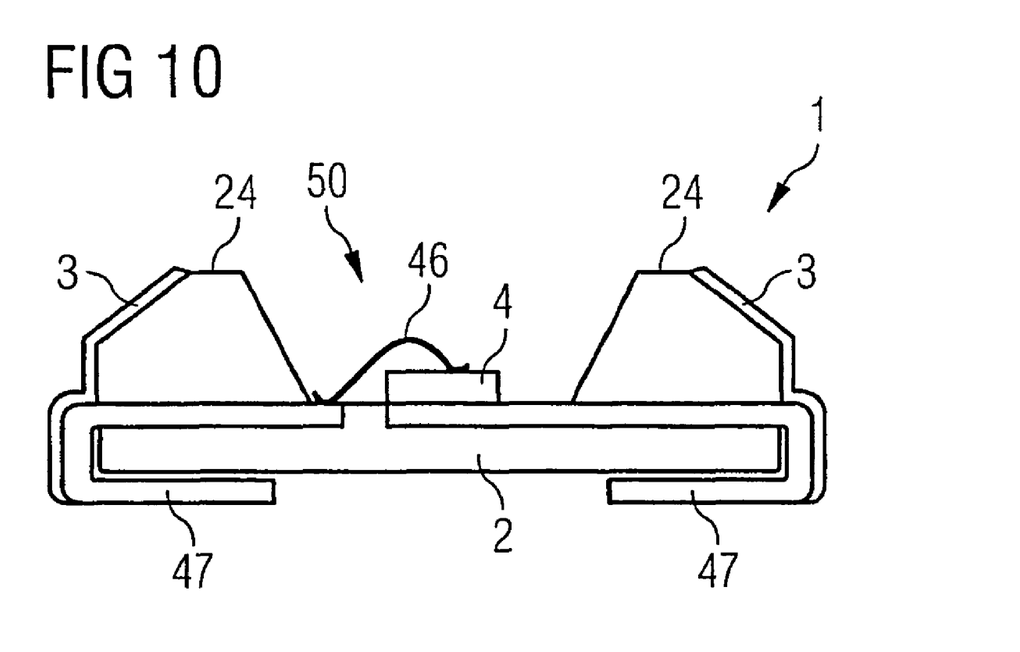
FIG. 10 shows a schematic sectional view of a component in accordance with a fourth exemplary embodiment and of a housing in accordance with a seventh exemplary embodiment.

One example of such a housing with a leadframe 47 is illustrated in FIG. 10. It has e.g. a single luminescence diode chip 4, which is electrically conductively connected to two electrical connection conductors of the leadframe 47. The leadframe 47 is encapsulated with a housing body by moulding by means of an injection-moulding composition or casting composition comprising plastic.

All the external side faces of the housing 2 are provided with a screening layer 3, these e.g. also extending over portions of the leadframe.

The luminescence diode chips 4 are light-emitting diode chips, by way of example; they are preferably thin-film light-emitting diode chips.

A thin-film light-emitting diode chip is distinguished in particular by the following characteristic features:
a reflective layer is applied or formed at a first main area of a radiation-generating epitaxial layer sequence that faces towards a carrier element, said reflective layer reflecting at least one portion of the electromagnetic radiation generated in the epitaxial layer sequence back into the latter;
the epitaxial layer sequence has a thickness in the region of 20 µm or less, in particular in the region of 10 µm; and
the epitaxial layer sequence contains at least one semiconductor layer with at least one area which has an intermixing structure which ideally leads to an approximately ergodic distribution of the light in the epitaxial layer sequence, that is to say that it has an as far as possible ergodically stochastic scattering behaviour.

A basic principle of a thin-film light-emitting diode chip is described for example in I. Schnitzer et al., "30% external quantum efficiency from surface textured, thin-film light-emitting diodes", Appl. Phys. Lett. 63 (16), 18 Oct. 1993, 2174-2176, the disclosure content of which in this respect is hereby incorporated by reference.

A thin-film light-emitting diode chip is, to a good approximation, a Lambert surface radiator and is therefore particularly well suited to application in the component, in particular for a headlight.

In the exemplary embodiments described above, at least one portion of the screening layer 3 or the entire screening layer 3 may be applied by means of pad printing. Different method stages of an exemplary method of this type are illustrated in FIGS. 11 to 13.

A pad 100 is provided with a screening material 101. For this purpose, the pad is for example pressed onto an apparatus on which the screening material has been applied. Apparatuses of this type are referred to as a printing plate or block. The pad 100 comprises a highly elastic material which, by way of example, has or comprises a rubber. Silicone rubber is particularly suitable.

Figure 11:
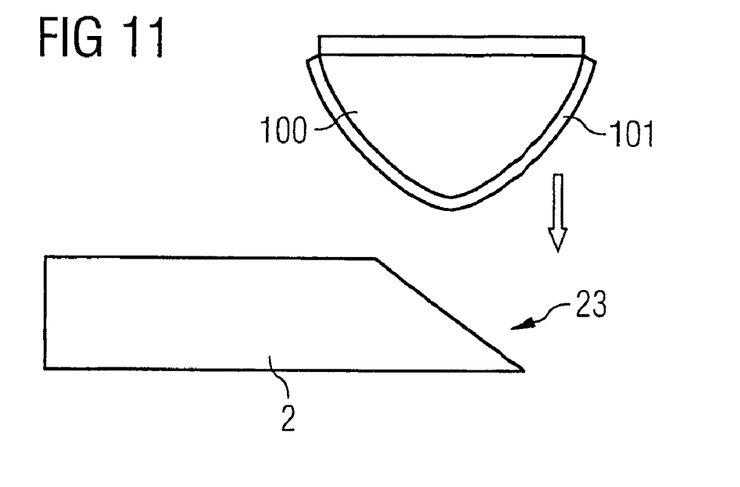
FIGS. 11 to 13 show schematic sectional views of different method stages of an exemplary embodiment of the method.

FIG. 11 illustrates a pad 100 wetted with a screening material 101 such as black ink, by way of example. The pad 100 is guided downwards onto an oblique exterior side face 23 of a housing 2. The direction of movement of the pad 100, indicated by an arrow in FIG. 11, runs perpendicular to a mounting plane of the housing 2. The exterior side face 23 to be printed is thus inclined by an angle of less than 90°, for example 45° with respect to the direction along which the pad 100 is guided onto the housing 2.

Figure 12:
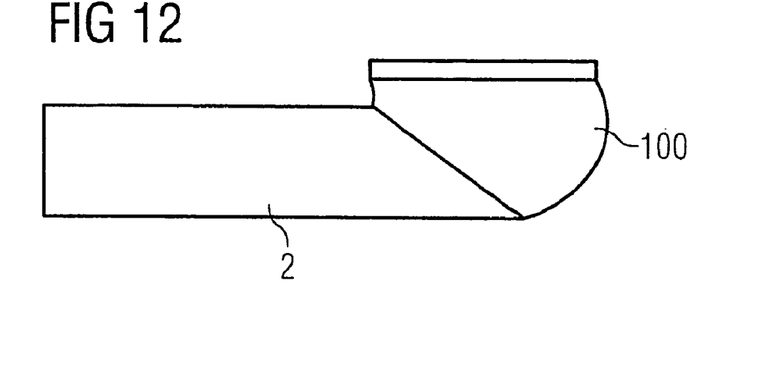
Figure 13:
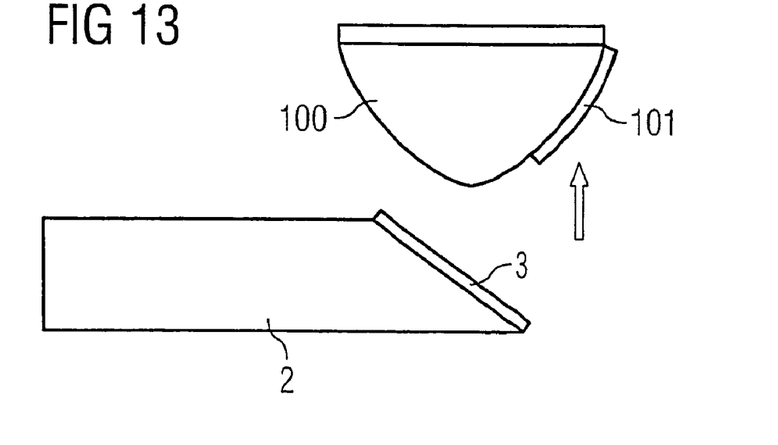

When the pad 100 is pressed against the housing 2, it deforms and matches the oblique profile of the exterior side face 23 to be printed, see FIG. 12.

The pad 100 is subsequently guided away from the housing 2 again, which is in turn indicated by an arrow in FIG. 13. That screening material which comes into contact with the exterior side face 23 to be printed when the pad is pressed on the latter adheres to the housing 2 and forms at least one portion of a screening layer 3, see FIG. 13.

These method steps can be repeated any number of times as required. By means of method steps of this type it is also possible, by way of example, to successively apply different screening materials on exterior side faces of the housing 2. It is possible, of course, for all the exterior side faces to be completely covered with one or more screening materials 101 by means of pad printing.

As an alternative or in addition to pad printing, the screening layer may also be applied at least partly by means of screen printing. For this purpose, by way of example, a screen or a mask is applied to an exterior side face of the housing, to which a screening material is subsequently applied. The screening material has a viscosity suitable for screen printing. It may comprise e.g. a black lacquer or some other black ink. A squeegee is used to distribute the screening material in cutouts in the screen or the mask on the exterior side face.

As a further alternative or supplementary method, e.g. inkjet printing is also suitable for applying screening material. In particular absorbent ink, e.g. black ink, can be applied in this way. By way of example, a conventional CIJ printer ("continuous inkjet" printer), is used for this purpose. The use of a DOD printer ("drop on demand" printer) is likewise possible.

In addition or as an alternative to the methods described above, metal layers, in particular, may be applied for example by means of vapour deposition, sputtering or adhesive-bonding.

Furthermore, by way of example, plastic coating is also suitable for applying the screening material.

In addition or as an alternative, both metal layers and plastic layers can also be applied by means of powder coating, for example. It is possible e.g. to use an electrostatic powder coating or a different type of powder coating. The screening material is applied in the form of a powder in this case. The latter is subsequently heated, as a result of which it combines to form an integral layer, by way of example, and adheres to the surface to which it was applied.

The invention is not restricted to the exemplary embodiments by the description of the invention on the basis of said exemplary embodiments. Rather, the invention encompasses any new feature and also any combination of features, which in particular comprises any combination of features in the patent claims, even if this feature or this combination itself is not explicitly specified in the patent claims or exemplary embodiments.

The invention claimed is:

1. A housing for an electromagnetic-radiation-emitting optoelectronic component, comprising:
   exterior side faces for the housing; and
   a screening layer applied on at least part of the exterior side faces and being suitable for screening an electromagnetic radiation;
   wherein the exterior side faces are at least partially inclined with respect to a plane extending perpendicularly to a mounting plane of the housing;

wherein the housing of the electromagnetic-radiation-emitting component comprises a housing body and a leadframe;
wherein the leadframe is encapsulated with the housing body; and
wherein the screening layer extends over portions of the leadframe.

2. The housing according to claim 1, wherein the screening layer has a black material.

3. The housing according to claim 1, wherein the screening layer has a lacquer.

4. The housing according to claim 1, wherein the exterior side faces comprise external faces of a housing body which has ceramic material.

5. The housing according to claim 1, wherein the exterior side faces comprise external faces of a housing body which has plastic material.

6. The housing according to claim 1, wherein the exterior side faces are inclined with respect to the plane extending perpendicularly to the mounting plane at least partly between 30° and 60° inclusive.

7. The housing according to claim 1, wherein at least one exterior side face is essentially completely covered with the screening layer.

8. The housing according to claim 1, wherein the screening layer comprises plastic.

9. An electromagnetic-radiation-emitting component having at least one luminescence diode, comprising a housing according to claim 1.

10. A method for producing a housing for an electromagnetic-radiation-emitting optoelectronic component or an electromagnetic-radiation-emitting component, comprising the steps of:
providing a housing or a component having a housing including exterior side faces which are at least partly inclined with respect to a plane extending perpendicularly to a mounting plane of the housing, wherein the housing comprises a housing body and a leadframe encapsulated with the housing body; and
applying a screening layer to at least one portion of exterior side faces of the housing and to the leadframe such that the screening layer extends over portions of the leadframe.

11. The method according to claim 10, wherein applying the screening layer comprises the use of pad printing.

12. The method according to claim 10, wherein applying the screening layer comprises the use of screen printing.

13. The method according to claim 10, wherein applying the screening layer comprises the use of inkjet printing.

14. The method according to claim 10, wherein applying the screening layer comprises the use of plastic coating.

15. The method according to claim 10, wherein applying the screening layer comprises the use of powder coating.

16. An electromagnetic-radiation-emitting component comprising:
at least one luminescence diode chip; and
a housing with exterior side faces;
wherein the housing of the electromagnetic-radiation-emitting component comprises a housing body having a cavity, a bottom of said cavity being provided for mounting said at least one luminescence diode chip;
wherein a leadframe is encapsulated with the housing body and the luminescence diode chip is electrically conductively connected to two electrical conductors of said leadframe;
wherein the exterior side faces are at least partly inclined with respect to a plane extending perpendicularly to a mounting plane of the housing;
wherein a screening layer is applied on at least a part of the exterior side faces and is configured to screen electromagnetic radiation; and
wherein the screening layer extends over portions of the leadframe.

17. The electromagnetic-radiation-emitting component according to claim 16, wherein the luminescence diode chip is encapsulated with an encapsulant or covered with a radiation-transmissive covering plate.

18. The electromagnetic-radiation-emitting component according to claim 16, wherein the luminescence diode chip is disposed on the leadframe.

19. The housing according to claim 1, wherein the screening layer comprises a reflective layer on which an absorbent layer is applied.

20. The housing according to claim 19, wherein the absorbent layer comprises a black lacquer.

21. The housing according to claim 19, wherein the absorbent layer comprises a black plastic.

22. The housing according to claim 1, wherein all of the exterior side faces of the housing are provided with the screening layer.

23. The housing according to claim 22, wherein the exterior side faces are completely covered with the screening layer.

24. The housing according to claim 1, wherein the screening layer includes a material that reflects the electromagnetic radiation.

25. The housing according to claim 1, wherein the screening layer includes a material that absorbs the electromagnetic radiation.

* * * * *